United States Patent
Yu et al.

(10) Patent No.: US 12,123,968 B2
(45) Date of Patent: Oct. 22, 2024

(54) SYSTEMS AND METHODS FOR DIGITAL SIGNAL CHIRP GENERATION USING FREQUENCY MULTIPLIERS

(71) Applicant: Mixed-Signal Devices Inc., Irvine, CA (US)

(72) Inventors: Tommy Yu, Orange, CA (US); Avanindra Madisetti, Coto De Caza, CA (US)

(73) Assignee: Mixed-Signal Devices Inc., Irvine, CA (US)

( * ) Notice: Subject to any disclaimer, the term of this patent is extended or adjusted under 35 U.S.C. 154(b) by 232 days.

(21) Appl. No.: 17/650,034

(22) Filed: Feb. 4, 2022

(65) Prior Publication Data

US 2022/0252694 A1    Aug. 11, 2022

Related U.S. Application Data

(60) Provisional application No. 63/146,261, filed on Feb. 5, 2021.

(51) Int. Cl.
*G01S 7/282* (2006.01)
*H04B 1/04* (2006.01)
*H04B 1/69* (2011.01)

(52) U.S. Cl.
CPC .............. *G01S 7/282* (2013.01); *H04B 1/04* (2013.01); *H04B 1/69* (2013.01); *H04B 2001/6912* (2013.01)

(58) Field of Classification Search
CPC .. H03M 1/0675; G06F 1/0328; G06F 1/0335; H03C 3/00; H01Q 3/22
See application file for complete search history.

(56) References Cited

U.S. PATENT DOCUMENTS

| | | | | |
|---|---|---|---|---|
| 3,618,097 A | * | 11/1971 | McLeod, Jr. | H01Q 3/22 342/373 |
| 4,130,811 A | * | 12/1978 | Katz | H03C 3/00 342/200 |

(Continued)

FOREIGN PATENT DOCUMENTS

| | | |
|---|---|---|
| CN | 1795615 A | 6/2006 |
| CN | 205123713 U | 3/2016 |

(Continued)

OTHER PUBLICATIONS

Extended European Search Report for European Application No. 17872454.8, Search completed May 25, 2020, Mailed Jun. 4, 2020, 15 Pgs.

(Continued)

*Primary Examiner* — Bernarr E Gregory
(74) *Attorney, Agent, or Firm* — KPPB LLP

(57) ABSTRACT

Systems and methods for digitally synthesizing chirp signal in a low intermediate frequency (IF) band and using frequency multipliers to generate a higher frequency signal for radar applications are described. An embodiment includes a chirp signal generator that includes: a direct digital frequency synthesizer (DDFS) that is configured to receive an input sync signal and a frequency reference signal and generate several chirp signals at a first frequency that is in a low intermediate frequency (IF) band, several frequency multipliers that are configured to increase the chirp signals to higher frequencies and several bandpass filter circuits that are configured to remove nonlinearities from the chirp signals to generate a clean output signal.

20 Claims, 10 Drawing Sheets

(56) References Cited

U.S. PATENT DOCUMENTS

| | | |
|---|---|---|
| 4,499,594 A | 2/1985 | Lewinter |
| 5,682,161 A | 10/1997 | Ribner et al. |
| 5,914,933 A | 6/1999 | Cimini et al. |
| 5,955,980 A | 9/1999 | Hanna |
| 5,963,607 A * | 10/1999 | Romano .............. G06F 1/0328 708/271 |
| 6,570,521 B1 | 5/2003 | Schofield |
| 6,577,261 B2 | 6/2003 | Brooks et al. |
| 6,587,060 B1 | 7/2003 | Abbey |
| 6,614,377 B1 | 9/2003 | Adams et al. |
| 6,614,813 B1 * | 9/2003 | Dudley .............. G06F 1/0335 370/532 |
| 6,624,774 B2 | 9/2003 | Takeda et al. |
| 6,697,004 B1 | 2/2004 | Galton et al. |
| 6,707,404 B1 | 3/2004 | Mlmaz |
| 6,724,249 B1 | 4/2004 | Nilsson |
| 6,795,003 B2 | 9/2004 | Wang et al. |
| 6,819,276 B1 | 11/2004 | Hossack |
| 6,867,721 B1 | 3/2005 | Lin |
| 7,109,808 B1 * | 9/2006 | Pelt .............. G06F 1/0342 327/107 |
| 7,176,820 B1 | 2/2007 | Fuller et al. |
| 7,209,063 B2 | 4/2007 | Sekimoto |
| 7,304,593 B2 | 12/2007 | Luecking et al. |
| 7,679,539 B2 | 3/2010 | Lee et al. |
| 8,294,605 B1 | 10/2012 | Pagnanelli |
| 8,949,699 B1 | 2/2015 | Gustlin |
| 9,065,480 B1 | 6/2015 | Tseng |
| 9,124,287 B1 | 9/2015 | Ho et al. |
| 9,130,586 B1 | 9/2015 | Raz |
| 9,413,394 B1 | 8/2016 | Lye et al. |
| 9,425,814 B1 | 8/2016 | Verma |
| 10,020,818 B1 | 7/2018 | Yu et al. |
| 10,367,522 B2 | 7/2019 | Yu et al. |
| 10,530,372 B1 | 1/2020 | Yu et al. |
| 10,812,087 B2 | 10/2020 | Yu et al. |
| 10,840,939 B2 | 11/2020 | Yu et al. |
| 11,258,448 B2 | 2/2022 | Yu et al. |
| 11,405,045 B2 | 8/2022 | Yu et al. |
| 11,777,511 B2 | 10/2023 | Yu et al. |
| 2001/0022555 A1 | 9/2001 | Lee et al. |
| 2002/0053986 A1 | 5/2002 | Brooks et al. |
| 2002/0057214 A1 | 5/2002 | Brooks et al. |
| 2002/0061086 A1 | 5/2002 | Adachi et al. |
| 2002/0093442 A1 | 7/2002 | Gupta et al. |
| 2003/0128143 A1 | 7/2003 | Yap et al. |
| 2003/0137359 A1 | 7/2003 | Patana et al. |
| 2003/0174080 A1 | 9/2003 | Brooks et al. |
| 2003/0179121 A1 | 9/2003 | Gupta et al. |
| 2003/0227401 A1 | 12/2003 | Yang et al. |
| 2004/0032355 A1 | 2/2004 | Melanson et al. |
| 2004/0066321 A1 | 4/2004 | Brooks et al. |
| 2004/0081266 A1 | 4/2004 | Adachi et al. |
| 2004/0108947 A1 | 6/2004 | Yang et al. |
| 2004/0228416 A1 | 11/2004 | Anderson et al. |
| 2004/0233084 A1 | 11/2004 | Brooks et al. |
| 2004/0233085 A1 | 11/2004 | Fukuda et al. |
| 2004/0252038 A1 | 12/2004 | Robinson et al. |
| 2005/0001750 A1 | 1/2005 | Lo et al. |
| 2005/0003785 A1 | 1/2005 | Jackson et al. |
| 2005/0012649 A1 | 1/2005 | Adams et al. |
| 2005/0030212 A1 | 2/2005 | Brooks et al. |
| 2005/0057385 A1 | 3/2005 | Gupta et al. |
| 2005/0062627 A1 | 3/2005 | Jelonnek et al. |
| 2005/0063505 A1 | 3/2005 | Dubash et al. |
| 2005/0088327 A1 | 4/2005 | Yokoyama et al. |
| 2005/0093726 A1 | 5/2005 | Hezar et al. |
| 2005/0116850 A1 | 6/2005 | Hezar et al. |
| 2005/0128111 A1 | 6/2005 | Brooks et al. |
| 2005/0156767 A1 | 7/2005 | Melanson et al. |
| 2005/0156768 A1 | 7/2005 | Melanson et al. |
| 2005/0156771 A1 | 7/2005 | Melanson et al. |
| 2005/0162222 A1 | 7/2005 | Hezar et al. |
| 2005/0207480 A1 | 9/2005 | Norsworthy et al. |
| 2005/0237119 A1 | 10/2005 | Irie |
| 2005/0266805 A1 | 12/2005 | Jensen et al. |
| 2005/0285685 A1 | 12/2005 | Frey et al. |
| 2006/0028364 A1 | 2/2006 | Rivoir et al. |
| 2006/0038708 A1 | 2/2006 | Luh et al. |
| 2006/0044057 A1 | 3/2006 | Hezar et al. |
| 2006/0109153 A1 | 5/2006 | Gupta et al. |
| 2006/0115036 A1 | 6/2006 | Adachi et al. |
| 2006/0164276 A1 | 7/2006 | Luh et al. |
| 2006/0290549 A1 | 12/2006 | Laroia et al. |
| 2007/0001776 A1 | 1/2007 | Li et al. |
| 2007/0013566 A1 | 1/2007 | Chuang et al. |
| 2007/0018866 A1 | 1/2007 | Melanson et al. |
| 2007/0035425 A1 | 2/2007 | Hinrichs et al. |
| 2007/0080843 A1 | 4/2007 | Lee et al. |
| 2007/0126618 A1 | 6/2007 | Tanaka et al. |
| 2007/0152865 A1 | 7/2007 | Melanson et al. |
| 2007/0165708 A1 | 7/2007 | Darabi et al. |
| 2007/0279034 A1 | 12/2007 | Roh et al. |
| 2008/0062022 A1 | 3/2008 | Melanson et al. |
| 2008/0062024 A1 | 3/2008 | Maeda et al. |
| 2008/0100486 A1 | 5/2008 | Lin et al. |
| 2008/0180166 A1 | 7/2008 | Gustat et al. |
| 2008/0191713 A1 | 8/2008 | Hauer et al. |
| 2008/0198050 A1 | 8/2008 | Akizuki et al. |
| 2008/0211588 A1 | 9/2008 | Frey et al. |
| 2008/0272945 A1 | 11/2008 | Melanson et al. |
| 2008/0272946 A1 | 11/2008 | Melanson et al. |
| 2009/0083567 A1 | 3/2009 | Kim et al. |
| 2009/0096649 A1 | 4/2009 | Ferri et al. |
| 2009/0220219 A1 | 9/2009 | McLeod et al. |
| 2009/0309774 A1 | 12/2009 | Hamashita et al. |
| 2010/0045498 A1 | 2/2010 | Liu et al. |
| 2010/0052960 A1 | 3/2010 | Lakdawala et al. |
| 2010/0074368 A1 | 3/2010 | Karthaus et al. |
| 2010/0164773 A1 | 7/2010 | Clement et al. |
| 2010/0214143 A1 | 8/2010 | Nakamoto et al. |
| 2010/0219999 A1 | 9/2010 | Oliaei et al. |
| 2010/0225517 A1 | 9/2010 | Aiba et al. |
| 2010/0265112 A1 | 10/2010 | Ek et al. |
| 2010/0283648 A1 | 11/2010 | Niwa et al. |
| 2010/0295715 A1 | 11/2010 | Sornin et al. |
| 2011/0006936 A1 | 1/2011 | Lin et al. |
| 2011/0050472 A1 | 3/2011 | Melanson et al. |
| 2011/0149155 A1 | 6/2011 | Lin et al. |
| 2011/0299642 A1 | 12/2011 | Norsworthy et al. |
| 2012/0063519 A1 | 3/2012 | Oliaei et al. |
| 2012/0161864 A1 | 6/2012 | Lee et al. |
| 2012/0194369 A1 | 8/2012 | Galton et al. |
| 2012/0200437 A1 | 8/2012 | Moue et al. |
| 2012/0242521 A1 | 9/2012 | Kinyua et al. |
| 2012/0275493 A1 | 11/2012 | Fortier et al. |
| 2012/0280843 A1 | 11/2012 | Tsai et al. |
| 2012/0286982 A1 | 11/2012 | Kajita et al. |
| 2013/0068019 A1 | 3/2013 | Takase et al. |
| 2013/0099949 A1 | 4/2013 | Wagner et al. |
| 2013/0169460 A1 | 7/2013 | Obata et al. |
| 2013/0259103 A1 | 10/2013 | Jensen et al. |
| 2014/0028374 A1 | 1/2014 | Zare-Hoseini et al. |
| 2014/0035769 A1 | 2/2014 | Rajaee et al. |
| 2014/0070969 A1 | 3/2014 | Shu |
| 2014/0113575 A1 | 4/2014 | Mitani et al. |
| 2014/0139293 A1 | 5/2014 | Tsangaropoulos et al. |
| 2014/0286467 A1 | 9/2014 | Norsworthy et al. |
| 2014/0307825 A1 | 10/2014 | Ostrovskyy et al. |
| 2014/0320325 A1 | 10/2014 | Muthers et al. |
| 2014/0368365 A1 | 12/2014 | Quiquempoix et al. |
| 2015/0002325 A1 | 1/2015 | Lin |
| 2015/0009054 A1 | 1/2015 | Ono et al. |
| 2015/0036766 A1 | 2/2015 | Elsayed et al. |
| 2015/0061907 A1 | 3/2015 | Miglani |
| 2015/0084797 A1 | 3/2015 | Singh et al. |
| 2015/0109157 A1 | 4/2015 | Caldwell et al. |
| 2015/0116138 A1 | 4/2015 | Li et al. |
| 2015/0146773 A1 | 5/2015 | Ma et al. |
| 2015/0171887 A1 | 6/2015 | Okuda |
| 2015/0341159 A1 | 11/2015 | Norsworthy et al. |
| 2015/0349794 A1 | 12/2015 | Lin |
| 2016/0013805 A1 | 1/2016 | Maehata |
| 2016/0049947 A1 | 2/2016 | Adachi |

(56) References Cited

U.S. PATENT DOCUMENTS

| | | |
|---|---|---|
| 2016/0050382 A1 | 2/2016 | Rizk et al. |
| 2016/0065236 A1 | 3/2016 | Ahmed et al. |
| 2016/0149586 A1 | 5/2016 | Roh et al. |
| 2016/0254821 A1 | 9/2016 | Luo et al. |
| 2016/0336946 A1 | 11/2016 | Ho et al. |
| 2016/0344404 A1 | 11/2016 | Miglani et al. |
| 2016/0359499 A1 | 12/2016 | Bandyopadhyay |
| 2016/0373125 A1 | 12/2016 | Pagnanelli et al. |
| 2017/0033801 A1 | 2/2017 | Lo et al. |
| 2017/0041019 A1 | 2/2017 | Miglani et al. |
| 2017/0045403 A1 | 2/2017 | Zanbaghi et al. |
| 2017/0093407 A1 | 3/2017 | Kim et al. |
| 2017/0102248 A1 | 4/2017 | Maurer et al. |
| 2017/0134055 A1 | 5/2017 | Ebrahimi et al. |
| 2017/0163295 A1 | 6/2017 | Talty et al. |
| 2017/0170839 A1 | 6/2017 | Zhao et al. |
| 2017/0170840 A1 | 6/2017 | Zhao |
| 2017/0184645 A1 | 6/2017 | Sawataishi |
| 2017/0222652 A1 | 8/2017 | Adachi |
| 2017/0222658 A1 | 8/2017 | Miglani et al. |
| 2017/0250662 A1 | 8/2017 | Cope et al. |
| 2017/0276484 A1 | 9/2017 | Marx et al. |
| 2017/0288693 A1 | 10/2017 | Kumar et al. |
| 2017/0310338 A1 | 10/2017 | Hori |
| 2017/0317686 A1 | 11/2017 | Dartois |
| 2018/0145700 A1 | 5/2018 | Yu et al. |
| 2019/0058482 A1 | 2/2019 | Inoue et al. |
| 2019/0280704 A1 | 9/2019 | Bodnar et al. |
| 2019/0356329 A1 | 11/2019 | Yu et al. |
| 2020/0106448 A1 | 4/2020 | Yu et al. |
| 2021/0175889 A1 | 6/2021 | Yu et al. |
| 2022/0006465 A1 | 1/2022 | Yu et al. |
| 2022/0085823 A1 | 3/2022 | Yu et al. |
| 2024/0063803 A1 | 2/2024 | Yu et al. |

FOREIGN PATENT DOCUMENTS

| | | | | |
|---|---|---|---|---|
| CN | 105814801 A | | 7/2016 | |
| CN | 110168930 A | | 8/2019 | |
| CN | 113796013 A | * | 12/2021 | .......... H03M 1/0675 |
| CN | 110168930 B | | 9/2023 | |
| CN | 116829975 A | | 9/2023 | |
| CN | 117097279 A | | 11/2023 | |
| EP | 3542461 A1 | | 9/2019 | |
| EP | 3939167 A1 | | 1/2022 | |
| EP | 4288794 A1 | | 12/2023 | |
| HK | 40064766 A | | 7/2022 | |
| JP | 2024506035 A | | 2/2024 | |
| KR | 20020032387 A | | 5/2002 | |
| WO | 2016063038 A1 | | 4/2016 | |
| WO | 2016063038 A4 | | 7/2016 | |
| WO | 2018094380 A1 | | 5/2018 | |
| WO | 2020186255 A1 | | 9/2020 | |
| WO | 2022170351 A1 | | 8/2022 | |

OTHER PUBLICATIONS

International Preliminary Report on Patentability for International Application PCT/US2020/022857, issued Aug. 25, 2021, Mailed Sep. 23, 2021, 6 Pgs.

International Preliminary Report on Patentability for International Application PCT/US2017/062744, Report issued May 21, 2019, Mailed May 31, 2019, 8 Pgs.

International Search Report and Written Opinion for International Application No. PCT/US2022/070536, Search completed Mar. 18, 2022, Mailed Apr. 1, 2022, 12 Pgs.

International Search Report and Written Opinion for International Application No. PCT/US2017/062744, Search completed Jan. 17, 2018, Mailed Feb. 5, 2018, 13 Pgs.

International Search Report and Written Opinion for International Application No. PCT/US2020/022857, Search completed May 18, 2020, Mailed Jun. 15, 2020, 8 Pgs.

Aigner et al., "Advancement of MEMS into RF-Filter Applications", International Electron Devices Meetings, IEDM '02, Dec. 8-11, 2002, pp. 897-900.

Gomez-Garcia et al., "Linear Chirp Generator Based on Direct Digital Synthesis and Frequency Multiplication for Airborne FMCW Snow Probing Radar", 2014 IEEE MTT-S International Microwave Symposium (IMS2014), 4 pgs. Retrieved on Mar. 12, 2022 from <https://ieeexplore.ieee.org/document/6848668>.

Lam, "A Review of the Recent Development of MEMS and Crystal Oscillators and Their Impacts on the Frequency Control Products Industry", Invited Paper, 2008 IEEE International Ultrasonics Symposium, Beijing, Nov. 2-5, 2008, 11 pages.

Majd et al., "Bandwidth Enhancement in Delta Sigma Modulator Transmitter Using Low Complexity Time-Interleaved Parallel Delta Sigma Modulator", AEU—International Journal of Electronics and Communications, Apr. 11, 2015, vol. 69, No. 7, pp. 1032-1038.

Park et al., "Adaptive Digital-Predistortion Linearization of Frequency Multipliers", IEEE Transactions on Microwave Theory and Techniques, Dec. 2003, vol. 51, No. 12, pp. 2516-2522. Retrieved on Mar. 12, 2022 from <https://ieeexplore.ieee.org/abstract/document/1256784>.

Pateti et al., "Chirp Signal Generator Based on Direct Digitalsynthesizer (DDS) for a Radar at 300 Ghz", International Journal of Innovative Technology and Exploring Engineering (IJITEE), Sep. 2019, ISSN: 2278-3075, vol. 8, No. 11S2. pp. 54-60, retrieved on Mar. 12, 2022 from <https://www.ijitee.org/wpcontent/uploads/papers/v8i11S2/K101009811S219.pdf>.

Piazza et al., "Piezoelectric Aluminum Nitride Vibrating Contour-Mode MEMS Resonators", Journal of Microelectromechanical Systems, Dec. 2006, vol. 15, No. 6, pp. 1406-1418.

Extended European Search Report for European Application No. 20770134.3, Search completed Dec. 16, 2022, Mailed Jan. 2, 2023, 12 Pgs.

International Preliminary Report on Patentability for International Application No. PCT/US2022/070536, Report issued Aug. 3, 2023, Mailed Aug. 17, 2023, 5 Pgs.

Sun, "High-Order Mismatch-Shaped Segmented Multibit ΔΣ DACs with Arbitrary Unit Weights", IEEE Transactions on Circuits and Systems—I: Regular Papers IEEE, US, Feb. 2012, vol. 59, No. 2, pp. 295-304, XP011394669, ISSN: 1549-8328, DOI: 10.1109/TCSI.2011.2163970.

* cited by examiner

SYSTEMS AND METHODS FOR DIGITAL SIGNAL CHIRP GENERATION USING FREQUENCY MULTIPLIERS

CROSS REFERENCE TO RELATED APPLICATIONS

This application claims priority under 35 U.S.C. 119(e) to U.S. Provisional Patent Application No. 63/146,261, entitled "Systems and Methods for Digital Signal Chirp Generation Using Frequency Multipliers" to Yu et al., filed Feb. 5, 2021, and that is hereby incorporated by reference in its entirety.

FIELD OF THE INVENTION

The present invention relates to chirp generators and more specifically to a using a digitally synthesized chirp signal and processing the signal using frequency multipliers to generate a higher frequency signal for radar applications.

BACKGROUND

A chirp is a signal in which the frequency increases (up-chirp) or decreases (down-chirp) with time. In some sources, the term chirp can be used interchangeably with sweep signal. It can be applied to sonar, radar, and laser systems, among various other applications. For automotive radar applications, it is usually called linear frequency modulated waveform (LFMW). LFMW signal can be specified in the following equation:

$$x(t) = \sin\left(2\pi\left(f_0 + \frac{\alpha}{2}t\right)t + \theta_0\right) \quad \text{(Equation 1)}$$

$f_0$: initial frequency of the chirp signal
$\alpha$: frequency ramp rate of the chirp signal
$\theta_0$: initial phase of the chirp signal A chirp signal can be generated with analog circuitry via a voltage-controlled oscillator (VCO), and a linearly or exponentially ramping control voltage.

SUMMARY OF THE INVENTION

Chirp generators that can utilize a digitally synthesized chirp signal in a low intermediate frequency (IF) band and process the chirp signal using frequency multipliers to generate a higher frequency signal for radar applications in accordance with embodiments of the invention are disclosed. In an embodiment of the invention, a chirp signal generator includes: a direct digital frequency synthesizer (DDFS) that is configured to receive an input sync signal and a frequency reference signal and generate several chirp signals at a first frequency that is in a low intermediate frequency (IF) band; several frequency multipliers that are configured to increase the chirp signals that are in the IF band to higher frequencies that are multiples of the first frequency; and several bandpass filter circuits that are configured to remove nonlinearities from the plurality of chirp signals to generate a clean output signal.

In a further embodiment, the chirp generator further includes: a first frequency doubler circuit that receives the first frequency and doubles the first frequency to generate a second frequency that is double the first frequency; a second frequency doubler circuit that receives the second frequency and doubles the second frequency to generate a third frequency that is double the second frequency; a third frequency doubler circuit that receives the third frequency and doubles the third frequency to generate a fourth frequency that is double the fourth frequency; a fourth frequency doubler circuit that receives the fourth frequency and doubles the fourth frequency to generate a fifth frequency that is double the fourth frequency.

In a further embodiment, the first frequency is in the 1562.5-1750 MHz range, the second frequency is in the 3125-3500 MHz range, the third frequency is in the 6250-7000 MHz range, the fourth frequency is in the 12.5-14 GHz range, and the fifth frequency is in the 25-28 GHz range.

In a further embodiment, the several bandpass filter stages includes a first bandpass filter circuit after the first frequency doubler circuit, a second bandpass filter circuit after the second frequency doubler circuit, and a third bandpass filter circuit after the third frequency doubler circuit.

In a further embodiment, the direct frequency synthesizer includes a high speed resonator that generates a frequency signal and an oscillator that receives the frequency signal and generates an output signal.

In a further embodiment, the chirp signal generator further includes several amplifier circuits that amplify an input chirp signal to generate an amplified output signal.

In a further embodiment, a chirp signal is denoted as x(t) where:

$$x(t) = \sin\left(2\pi\left(f_0 + \frac{\alpha}{2}t\right)t + \theta_0 + \varphi_n(t)\right)$$

$f_0$: initial frequency of the chirp signal,
$\alpha$: frequency ramp rate of the chirp signal,
$\theta_0$: initial phase of the chirp signal,
$\varphi_n(t)$: phase noise added in a digital-to-analog (DAC) process; where a chirp signal is generated that is twice a carrier frequency of x(t) by passing x(t) through a frequency doubler circuit, where the frequency doubler circuit output is y(t) where:

$$y(t) = x(t) * x(t) =$$
$$\left\{\sin\left(2\pi\left(f_0 + \frac{\alpha}{2}t\right)t + \theta_0 + \varphi_n(t)\right)\right\}^2 = \frac{1}{2}\left(1 - \cos\left(4\pi\left(f_0 + \frac{\alpha}{2}t\right)t + 2\theta_0 + 2\varphi_n(t)\right)\right)$$

In a further embodiment, a band-pass filter is used to select the desired $2^{nd}$ order harmonic from a frequency doubler, wherein a band-pass filter output is z(t) where:

$$z(t) = k * \cos(2\pi(2f_0 + \alpha t)t + 2\theta_0 + 2\varphi_n(t))$$

k: scale factor,
where the several frequency multipliers include four (4) frequency doubler stages, where the output of each stage is denoted as $z_i(t)$, (i=1,2,3,4), where:

$$z_1(t) = k_1 * \cos(2\tau(2f_0 + \alpha t)t + 2\theta_0 + 2\varphi_n(t))$$

$$z_2(t) = k_2 * \cos(2\pi(4f_0 + 2\alpha t)t + 4\theta_0 + 4\varphi_n(t))$$

$$z_3(t) = k_3 * \cos(2\pi(8f_0 + 4\alpha t)t + 8\theta_0 + 8\varphi_n(t))$$

$$z_4(t) = k_4 * \cos(2\pi(16f_0 + 8\alpha t)t + 16\theta_0 + 16\varphi_n(t))$$

In a further embodiment, the chirp signal generator further includes: a first frequency quadrupler circuit that receives the first frequency and quadruples the first frequency to generate a second frequency that is four times the first frequency; a second frequency quadrupler circuit that receives the second frequency and quadruples the second frequency to generate a third frequency that is quadruple the second frequency.

In a further embodiment, the chirp signal generator further includes filtering out harmonics and intermodulation components that do not fall within a particular frequency band to preserve a signal linearity during frequency multiplication stages.

DETAILED DESCRIPTION

Figure 1:
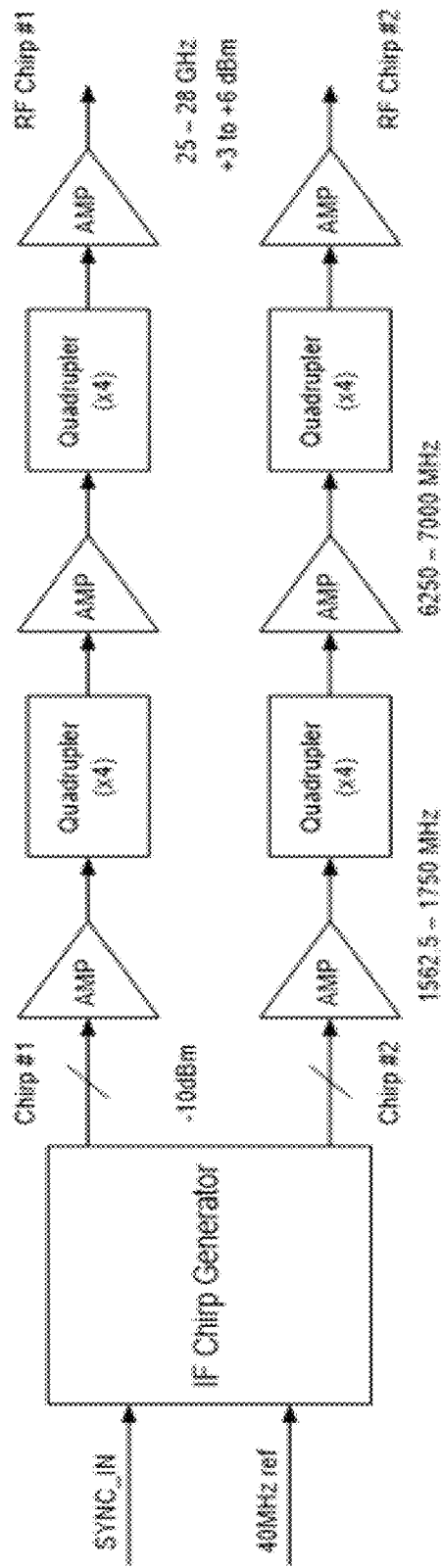
FIG. 1 illustrates an architecture of a chirp generator with frequency multipliers in accordance with an embodiment of the invention.

Turning now to the drawings, systems and methods for using digitally synthesized chirp signals and frequency multipliers to generate higher frequency RF chirp signals as appropriate for various applications including radar in accordance with various embodiments of the invention are illustrated. In many embodiments, a digital chirp signal can be generated using a digital direct-frequency synthesizer (DDFS) at a relatively low intermediate frequency (IF) band and the signal can be increased to a higher frequency using multiple stages of frequency multipliers as appropriate for radar applications.

In many embodiments, direct frequency synthesizers that provide a clean input signal can be utilized as described in U.S. Pat. No. 10,530,372 entitled "Systems and Methods for Digital Synthesis of Output Signals Using Resonators" filed Mar. 27, 2017, by Yu et al. (the Yu et al. patent), the relevant portions of which is incorporated by reference herein. In many embodiments, utilizing a DDFS as described by the Yu et al. patent can provide ultra-low phase noise and a pristine output signal. In many embodiments, the direct digital frequency synthesizer (DDFS) can include a high speed resonator that generates a frequency signal, an oscillator that receives the frequency signal and generates an output signal, a clock generator that receives the output signal of the oscillator and generates a clock signal from the output signal, a controller that generates a frequency control word describing a desired output digital signal, and a direct digital frequency synthesizer that receives the clock signal and the frequency control word and generates a desired digital output signal based on the clock signal and frequency control word.

In accordance with some embodiments, the output frequency may be controlled by a frequency control word (FCW) provided to the DDFS. In accordance with many embodiments, the frequency synthesizer can be equivalent to a voltage controlled oscillator (VCO) and can be used in a PLL for clock generation and/or jitter attenuation applications. In many embodiments, a direct digital frequency synthesizer (DDFS) block in accordance with various embodiments of this invention may be used for frequency and phase tracking.

A direct frequency synthesizer in accordance with some embodiments of the invention may provide a programmable oscillator. The programmable oscillator may be used to replace many existing standard crystal and quartz based oscillators providing numerous benefits including, but not limited to, a significant cost savings. In particular, the programmable oscillator may be used to replace many of the existing high performance crystal oscillators (XO) and voltage controlled oscillators (VCXO) available on the market.

The programmable frequency of the programmable oscillator provided by a direct frequency synthesizer in accordance with a number of embodiments of the invention may range from 1 MHz to 2 GHz (or higher) and be programmable with a frequency control word (FCW), which can be at least 32 bits in length. The frequency of the programmable oscillator provided by a direct frequency synthesizer in accordance with a number of embodiments of the invention may be factory programmable as a single frequency and/or limited to multiple selectable frequencies. In some embodiments, the programmable oscillator may be inter-integrated circuit (I2C) programmable and/or programmable using any other appropriate interface. In certain embodiments, the programmable frequency may be voltage controlled. The programmable oscillator may have less than 100 fs Jitter, integrated from 12 KHz-20 MHz, and have a +/−10 ppm frequency drift, with operating range in −40 to 85 degrees Celsius.

Furthermore, a programmable oscillator provided by a direct frequency synthesizer in accordance with some of embodiments of the invention may provide ultra-low phase noise (e.g., <=50 fs. Integrated from 12 KHz to 20 MHz). The programmable oscillator may have a single voltage supply (e.g., 3.3V, 2.5V, or 1.8V), and use an industry-standard package (e.g., 5×7, 3.2×5). As can readily be appreciated, the specific characteristics of a programmable oscillator provided by a direct frequency synthesizer in accordance with some of embodiments of the invention are not limited to any specific characteristics and can be determined based upon the requirements of specific applications in accordance with embodiments of the invention.

In many embodiments, a DDFS circuit may include lookup tables that store sine and cosine values. Furthermore, a control word may be used to set the output frequency of DDFS circuit in accordance with some embodiments. The DDFS circuit may provide a very high tuning range as the DDFS is used to set the frequency. Furthermore, a programmable oscillator is able to provide low phase noise with the ability to tune the output frequency of the programmable oscillator. In accordance with some embodiments, the DDFS circuit may use logic and memory to digitally construct the desired output signal, and an HS DAC may be used to convert the DDFS circuit output signal from the digital to the analog domain. Therefore, the DDFS method of constructing a signal may be almost entirely digital, and the precise amplitude, frequency, and phase may be known and controlled at all times.

In many embodiments, a chirp signal can be generated digitally by a digital signal processor (DSP) and digital to analog converter (DAC), using a direct digital frequency synthesizer (DDFS) and by varying the step in the numerically controlled oscillator. For example, digital codeword $x_n$ can be specified in the following equation:

$$x_n = x(t = nT_s) = \sin(\theta_n) \quad \text{Equation 2}$$

$$\theta_n = \begin{cases} \theta_0, & n = 0 \\ \theta_{n-1} + 2\pi f_{n-1} + \pi \alpha T_s^2, & n > 0 \end{cases}$$

$$f_n = \begin{cases} f_0 T_s, & n = 0 \\ f_{n-1} + \alpha T_s^2, & n > 0 \end{cases}$$

$T_s$: sample period of the DAC clock
$f_n$: frequency at time $t=nT_s$

Digital codeword can be converted into analog signal with a high-speed DAC. Digital frequency synthesis architecture can offer many advantages over the analog VCO implementation, including up to a perfectly linear frequency modulation, ultra-low phase noise, and ultra-fast frequency modulation rate.

Following the Nyquist sampling theorem, a sample rate for a high-speed DAC may need to be at least twice of the highest frequency contained in the signal. For an automotive radar application that operates in, for example, the 77 GHz band, the sample rate for digital synthesis DAC can be close to 200 GHz. Implementing a design with these specifications can be difficult to build and not power efficient. Accordingly, many embodiments of the invention provide for digitally synthesizing a chirp signal in a low intermediate frequency (IF) band and converting this low IF signal to a higher frequency RF signal through a series of frequency multipliers. The system architecture in accordance with many embodiments of the invention offers substantial power saving without compromising the benefit of digital frequency synthesis.

In several embodiments, a relatively low frequency (e.g., 1.5 to 2 GHz) chirp signal can be generated by a DDFS and processed through several stages of frequency doublers to convert the chirp signal from, for example, 1.75 GHz to a higher frequency range of 25-28 GHz, which may be appropriate for many radar applications, including automotive radar. In comparison, many currently existing radar applications may utilize an LC oscillator analog signal generated at e.g., 28 GHz or may use a phase-lock-loop (PLL) that is mixed in with a 28 GHz signal to generate the chirp signal, however, these signals generally suffer from non-linearities and have problems with phase noise. Accordingly, to improve the phase noise and increase the linearity of a chirp signal, many embodiments use a digitally synthesized chirp signal rather than an analog signal, and maintain the linearity of the digital signal by filtering phase noise and non-linearities at each stage of the frequency multiplication. Accordingly, many embodiments are able to preserve the frequency linearity of the chirp generation and thereby increase the accuracy of many radar applications.

Denote a low IF chirp signal as x(t) where:

$$x(t) = \sin\left(2\pi\left(f_0 + \frac{\alpha}{2}t\right)t + \theta_0 + \varphi_n(t)\right) \quad \text{Equation 3}$$

$f_0$: initial frequency of the chirp signal
$\alpha$: frequency ramp rate of the chirp signal
$\theta_0$: initial phase of the chirp signal
$\varphi_n(t)$: phase noise added in the DAC process To generate a chirp signal that is twice a carrier frequency of x(t), pass x(t) through a frequency doubler. Denote the frequency doubler output as y(t) where:

$$y(t) = x(t) * x(t) = \left\{\sin\left(2\pi\left(f_0 + \frac{\alpha}{2}t\right)t + \theta_0 + \varphi_n(t)\right)\right\}^2 = \quad \text{Equation 4}$$

$$\frac{1}{2}\left(1 - \cos\left(4\pi\left(f_0 + \frac{\alpha}{2}t\right)t + 2\theta_0 + 2\varphi_n(t)\right)\right)$$

Figure 6:
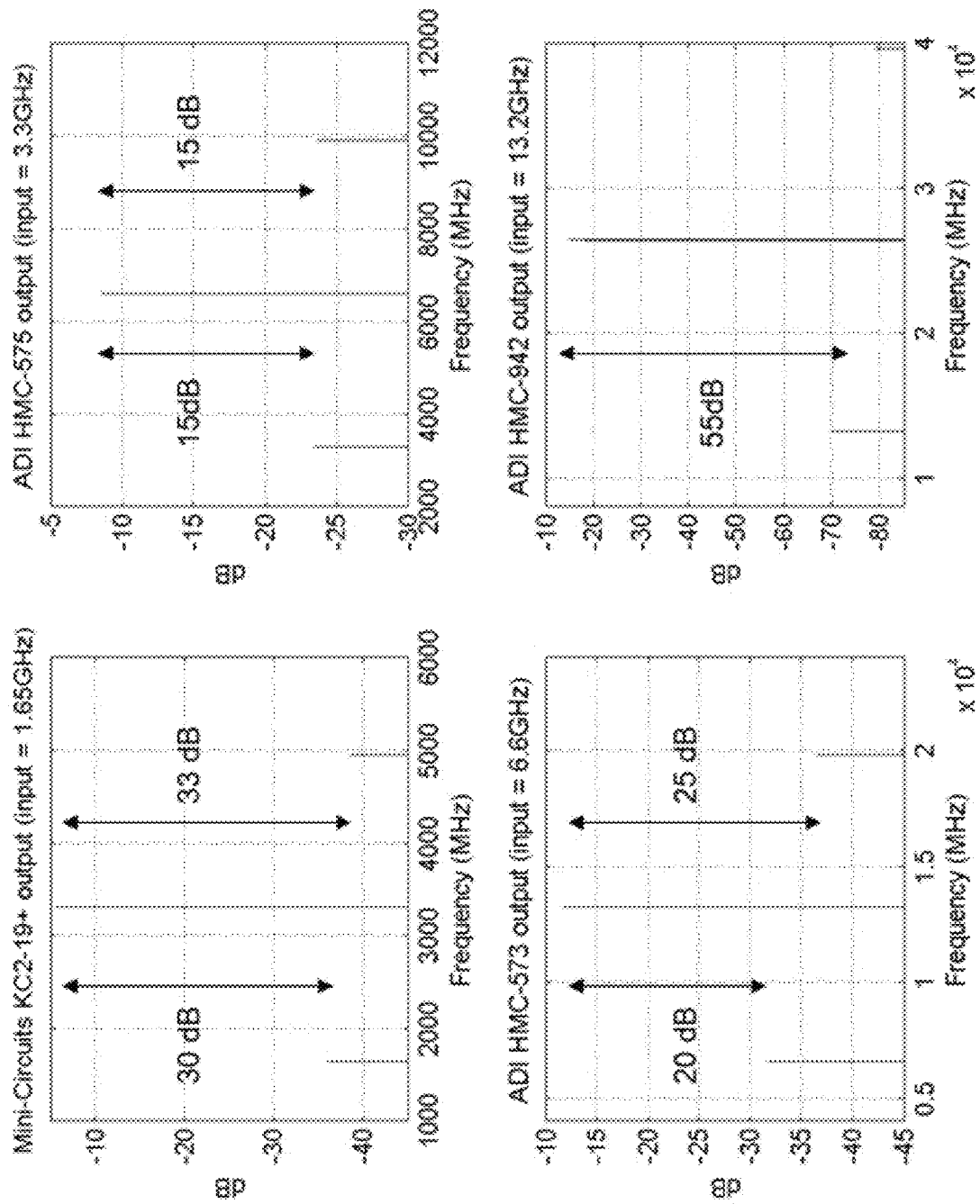
FIG. 6 illustrates graphs of doubler output spectrums in accordance with an embodiment of the invention.

As shown in equation 4 above, the frequency doubler output includes the chirp signal with twice the carrier frequency, bandwidth, and chirp rate of the input chirp signal and a DC component. In several embodiments, the output can also have the attenuated input signal due to signal leakage and the chirp signal at three times the carrier frequency due to circuit non-linearity. This is illustrated in FIG. 6 in accordance with an embodiment of the invention and can be shown in the following equation:

$$y(t) = \frac{1}{2}\left(1 - \cos\left(4\pi\left(f_0 + \frac{\alpha}{2}t\right)t + 2\theta_0 + 2\varphi_n(t)\right)\right) + \quad \text{Equation 5}$$

$$\alpha_1 \sin\left(2\pi\left(f_0 + \frac{\alpha}{2}t\right)t + \theta_0 + \varphi_n(t)\right) +$$

$$\alpha_3 \sin\left(6\pi\left(f_0 + \frac{\alpha}{2}t\right)t + 3\theta_0 + 3\varphi_n(t)\right)$$

In many embodiments, a band-pass filter can be used to select the desired $2^{nd}$ order harmonic from the frequency doubler. Denote band-pass filter output as z(t) where:

$$z(t)=k^*\cos(2\pi(2f_0+\alpha t)t+2\theta_0+2\varphi_n(t)) \quad \text{Equation 6}$$

k: scale factor

For a frequency multiplier that includes four (4) doublers, denote the output of each stage $z_i(t)$, (i=1,2,3,4) and they are represented in the following equations:

$$z_1(t)=k_1^*\cos(2\pi(2f_0+\alpha t)t+2\theta_0+2\varphi_n(t))$$

$$z_2(t)=k_2^*\cos(2\pi(4f_0+2\alpha t)t+4\theta_0+4\varphi_n(t))$$

$$z_3(t)=k_3^*\cos(2\pi(8f_0+4\alpha t)t+8\theta_0+8\varphi_n(t))$$

$$z_4(t)=k_4^*\cos(2\pi(16f_0+8\alpha t)t+16\theta_0+16\varphi_n(t))$$

As shown in these equations, the filtered frequency multiplier output comprises of the desired chirp output. The phase noise at the higher frequencies can be the phase noise at the IF frequency multiplied by the frequency multiplier ratio. In many embodiments, there is no additional phase noise in the frequency multiplier data path.

To preserve the signal linearity during frequency multiplication stages, many embodiments filter out any harmonics and intermodulation components that do not fall within a particular frequency band. In many embodiments, the frequency bands can be pre-planned as the artifacts and non-linearities during digital synthesis are known in advance and can be planned for during the filtering stages. Many embodiments use band pass filtering at each frequency multiplier stage to filter out the noise and preserve the signal linearity. A chirp generator with frequency multiplier in accordance with an embodiment of the invention is illustrated in FIG. 1.

As illustrates, an IF chirp generator which can be a direct digital frequency synthesizer (DDFS) that synthesizes a low intermediate frequency (IF) chirp signal and converts it to an analog signal through a high-speed DAC at a particular frequency, for example centered around 1.6 GHz. In many embodiments, the DDFS can be a frequency synthesizer that provides a clean input signal as described in U.S. Pat. No. 10,530,372 entitled "Systems and Methods for Digital Synthesis of Output Signals Using Resonators" filed Mar. 27, 2017, by Yu et al. (the Yu et al. patent), the relevant portions of which is incorporated by reference herein. In many embodiments, the low IF chirp signal is up converted into higher RF frequencies with multiple stages, e.g., 4 stages of frequency doubling operations. In certain embodiments, four stages of frequency doubling operation can be implemented as two frequency quadruplers.

The signal can be processed through several stages of frequency multipliers and amplifiers in order to obtain a frequency at a particular desired range, for example, a range of 25-28 GHz. In many embodiments, the architecture can include two stages of frequency quadruplers that convert a chirp signal from, for example 1.75 GHz to 28 GHz. In many embodiments, after each stage of frequency multiplication, the $2^{nd}$ order harmonics of the signal can be selected for further doubling. In many embodiments, the chirp generator architecture does not add an IQ imbalance and there is no phase noise degradation due to the charge pump.

As illustrated in FIG. 1, the IF chirp generator can receive a sync_in signal and a reference signal, for example a 40 MHz reference signal, and generate chirp #1 that is provided to an amplifier and a chirp #2 that is provided to an amplifier. Each chirp can be provided to a quadrupler (×4) and a subsequent amplifier. After a first stage, a signal can be increased from e.g., 1562.5-1750 MHz range to e.g., 6250-7000 MHz range. The signals can be provided to another quadrupler to increase the frequency to e.g., 25-28 GHz range.

Although FIG. 1 illustrates a particular chirp generator architecture with two stages of frequency quadruplers at a particular frequency, any of a variety of chirp generator architectures and frequencies can be utilized, including chirp generators with four stages of frequency doublers among others as appropriate to the requirements of specific applications in accordance with an embodiment of the invention. Filtering and pre-planning techniques for preserving signal linearity in accordance with many embodiments of the invention include using band pass filtering to remove non-linearities after each stage of frequency multiplication.

Figure 2:
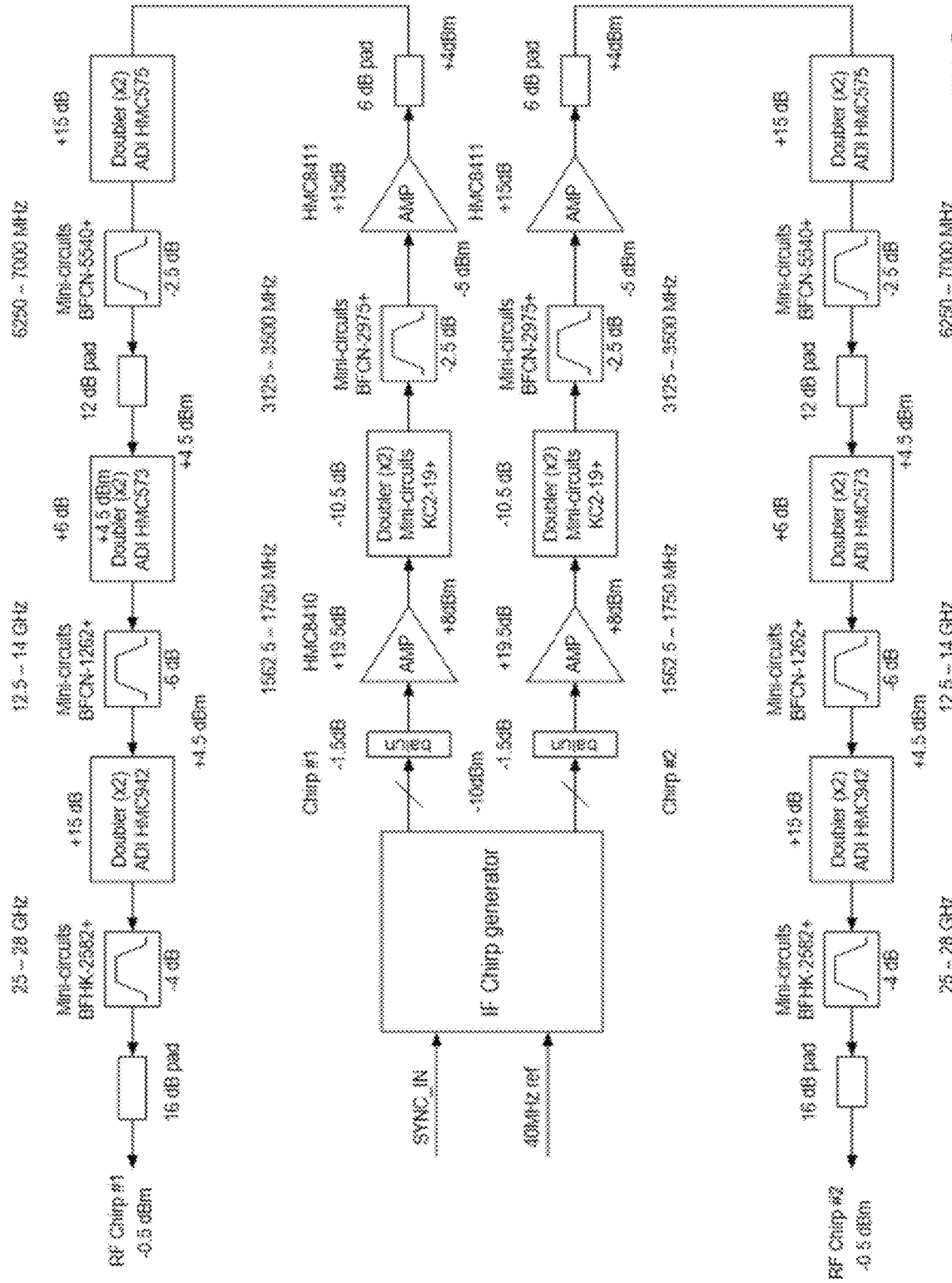
FIG. 2 illustrates an architecture of a chirp generator with band-pass filters in accordance with an embodiment of the invention.

FIG. 2 illustrates a chirp generator architecture with band pass filtering to remove non-linearities in accordance with an embodiment of the invention. As illustrated, the chirp generator can include a DDFS, several frequency doublers, and several band pass filters. As illustrates the IF chirp generator can be a frequency synthesizer that provides a clean input signal as described in U.S. Pat. No. 10,530,372 entitled "Systems and Methods for Digital Synthesis of Output Signals Using Resonators" filed Mar. 27, 2017, by Yu et al. (the Yu et al. patent), the relevant portions of which is incorporated by reference herein. As illustrated, the chirp signals can be provided to four stages of frequency doublers (×2), with each stage including an amplifier circuit and a bandpass filter circuit for harmonics filtering and that can remove nonlinearities at each stage. Accordingly, a chirp signal can be increased at each of the four stages as follows: from, for example, 1562.5-1750 MHz to 3125-3500 MHz, from 3125-3500 MHz to 6250-7000 MHz, from 6250-7000 MHz to 12.5-14 GHz, and from 12.5-14 GHz to 25-28 GHZ.

Although FIG. 2 illustrates a particular chirp generator architecture with band pass filters to remove non-linearities any of a variety of chirp generator architectures can be utilized as appropriate to the requirements of specific applications in accordance with an embodiment of the invention.

Figure 3:
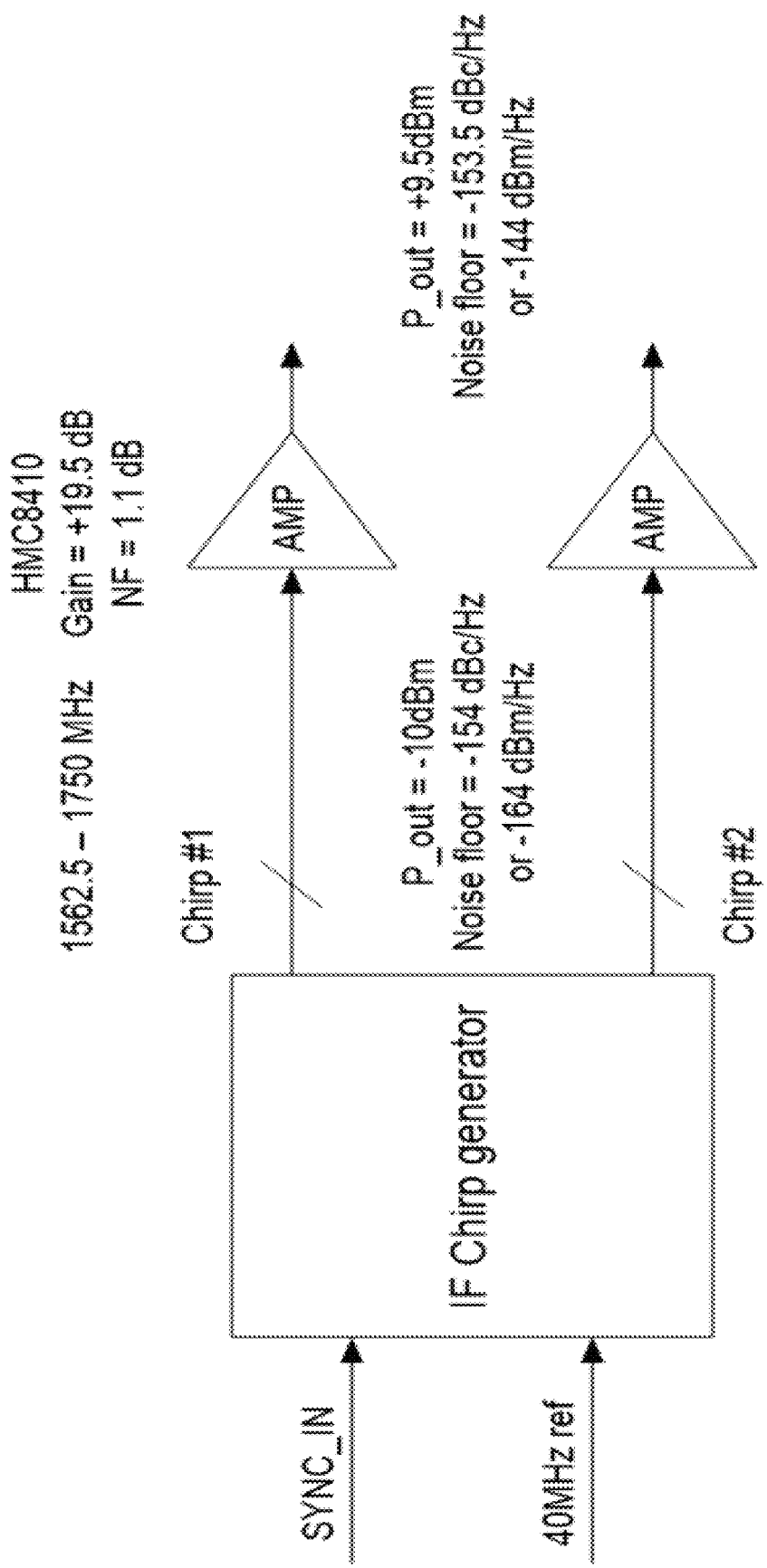
FIG. 3 illustrate an architecture of a $1^{st}$ stage amplifier noise in accordance with an embodiment of the invention.

FIG. 3 illustrates a $1^{st}$ stage amplifier noise architecture in accordance with an embodiment of the invention. In many embodiments, the DAC output power=−10 dBm with −154 dBc/Hz noise floor. In many embodiments, the amplifier output noise floor in dBc/Hz is $10 \log_{10}(10^{DAC_{noise}/10}+ 10^{AMP_{noise}/10})$. Amplifier noise in dBx/Hz=−174+NF−DAC output power. As illustrated, the low IF chirp signal noise floor can determine the noise performance of the final RF signal.

Although FIG. 3 illustrates a particular $1^{st}$ stage amplifier noise architecture, any of a variety of amplifier noise architecture can be utilized as appropriate to the requirements of specific applications in accordance with an embodiment of the invention.

Figure 4:
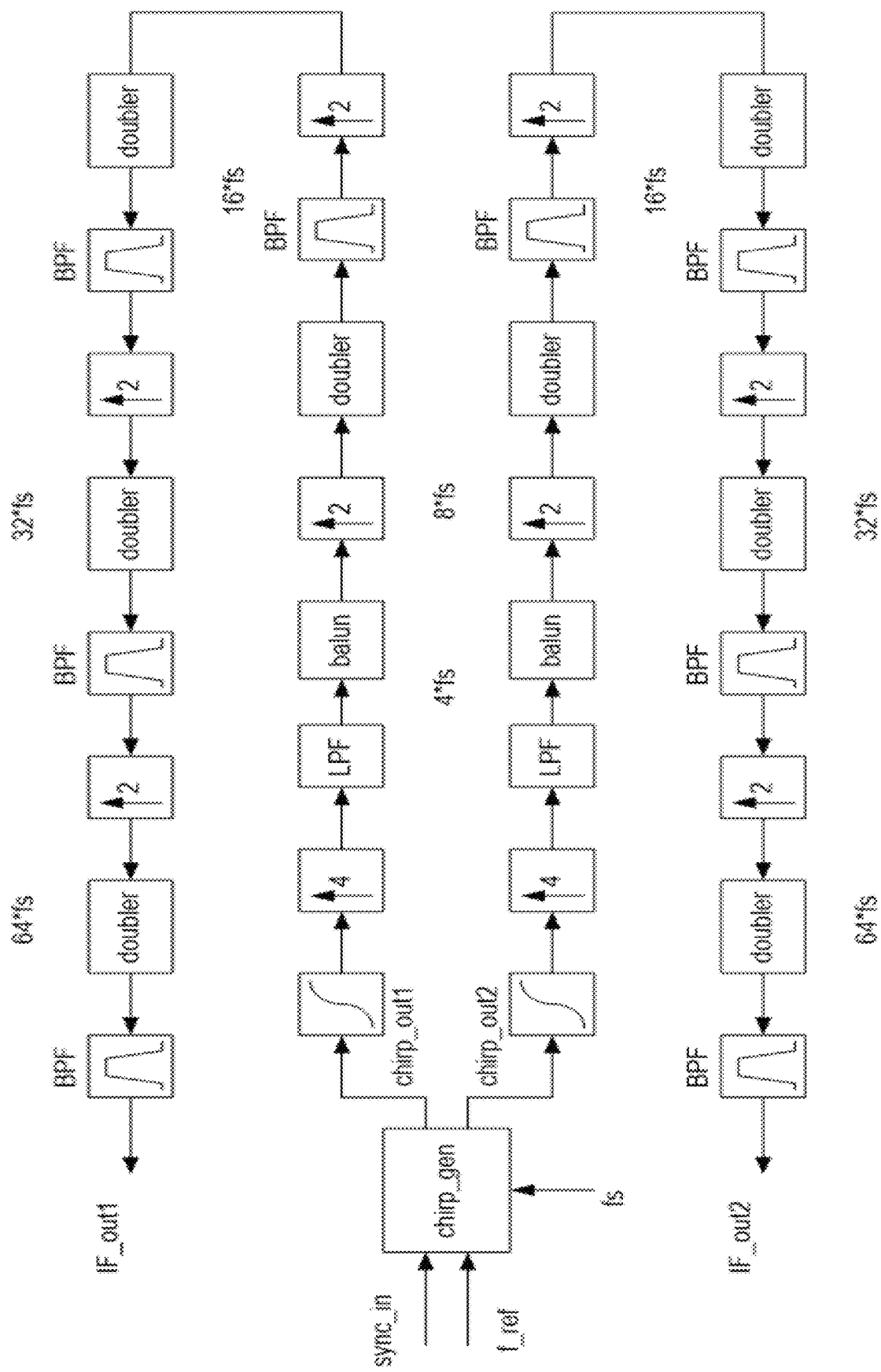
FIG. 4 illustrates an architecture of a chirp generator with band-pass filter modeling in accordance with an embodiment of the invention.

FIG. 4 illustrates a chirp generator with band pass filtering in accordance with an embodiment of the invention. As illustrated, the chirp generator includes a DDFS, four stages of frequency doublers, several low pass filters and several band-pass filters. In particular, a chirp generator can receive a sync_in signal and a frequency_ref signal and generator several chirp signals, including chirp_out1 and chirp_out2. The chirp signals can be amplified and passed through a low pass filter stage, and then provided to four stages of frequency doubler circuits. The chirp signals can also be provided to a series of band pass filter circuits as illustrated in FIG. 4.

Although FIG. 4 illustrates a particular chirp generator with band pass filtering architecture, any of a variety of chirp generator architectures can be utilized as appropriate to the requirements of specific applications in accordance with an embodiment of the invention.

Figure 5:
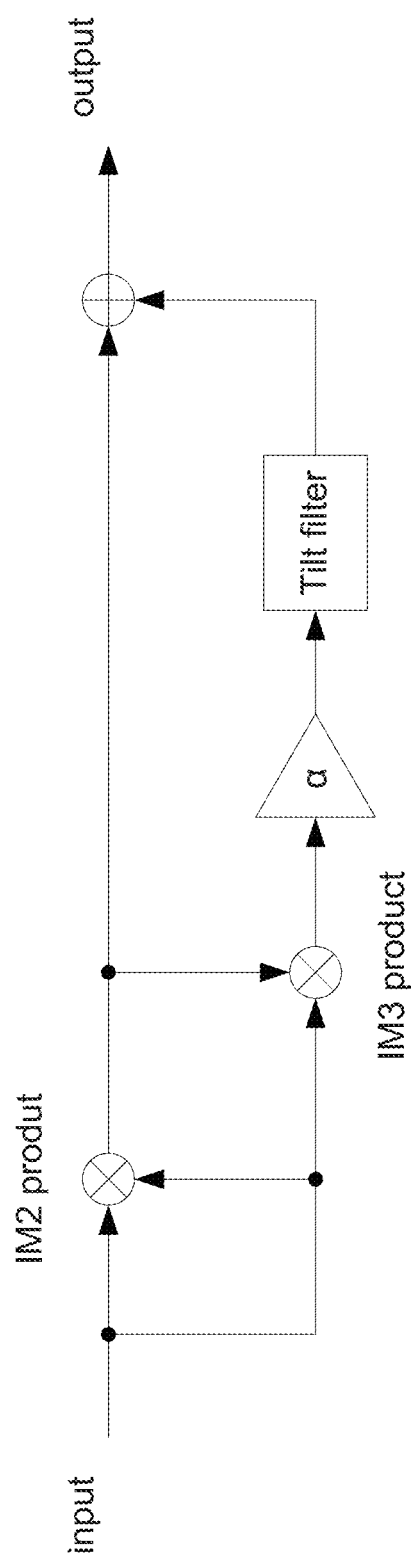
FIG. 5 illustrates a doubler modeling in accordance with an embodiment of the invention.

FIG. 5 illustrates a model of a frequency doubler with intermodulation in accordance with an embodiment of the invention. In many embodiments, intermodulation can generate un-wanted harmonics in the frequency doubling operation. In many embodiments, the doubler can be modeled as the sum of IM2 product and IM3 product with a gain passing through a tilt filter. In many embodiments, the gain models the $3^{rd}$ order non-linearity of the doubler. In several embodiments, the tilt filter models power delta between a fundamental tone and 3× frequency tone. Although FIG. 6 illustrates a particular doubler modeling, any of a variety of doubler models can be utilized as appropriate to the requirements of specific applications in accordance with an embodiment of the invention.

FIG. 6 illustrates several graphs of a doubler output spectrum in accordance with an embodiment of the invention. As illustrated, each graph corresponds to a particular input (1.65 GHz, 3.3 GHz, 6.6 GHz, and 13.2 GHz) with the X-axis corresponding to a particular frequency and the Y-axis corresponding to dB. As illustrated, each graph shows the simulated output spectrum at each frequency doubler. As illustrated, these output spectrums match well with the specification of certain components being used in the chirp generator design in accordance with various embodiments of the invention.

Figure 7:
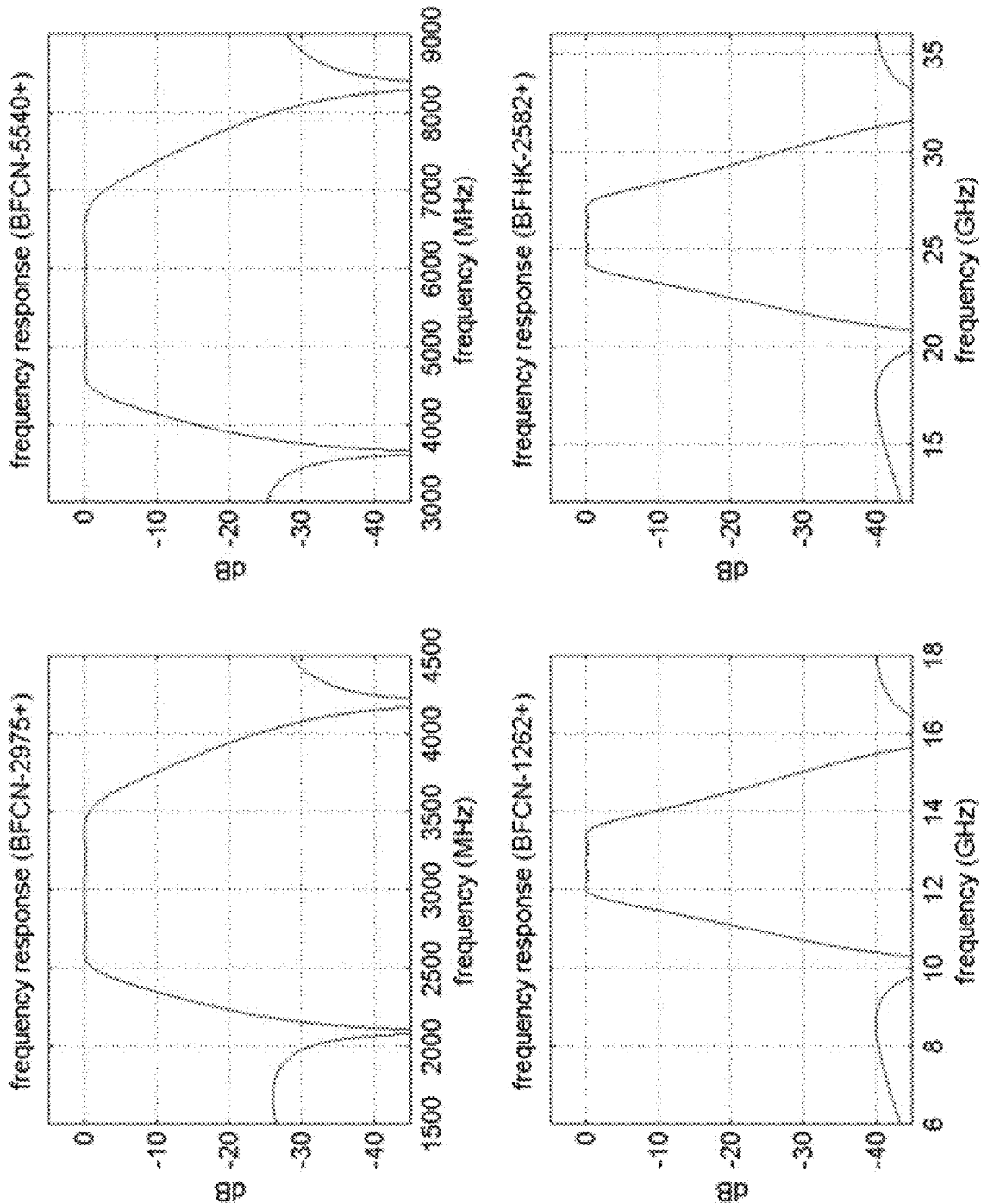
FIG. 7 illustrates graphs of band-pass filter frequency responses in accordance with an embodiment of the invention.

FIG. 7 illustrates several graphs of a band-pass filter frequency response in accordance with an embodiment of the invention. Each graph corresponds to a particular a simulated band-pass filter frequency response (e.g., 2975, 5540, 1262, and 2582). These frequency responses can match well with the specification of certain components used in the chirp generator design in accordance with several embodiments of the invention.

Figure 8:
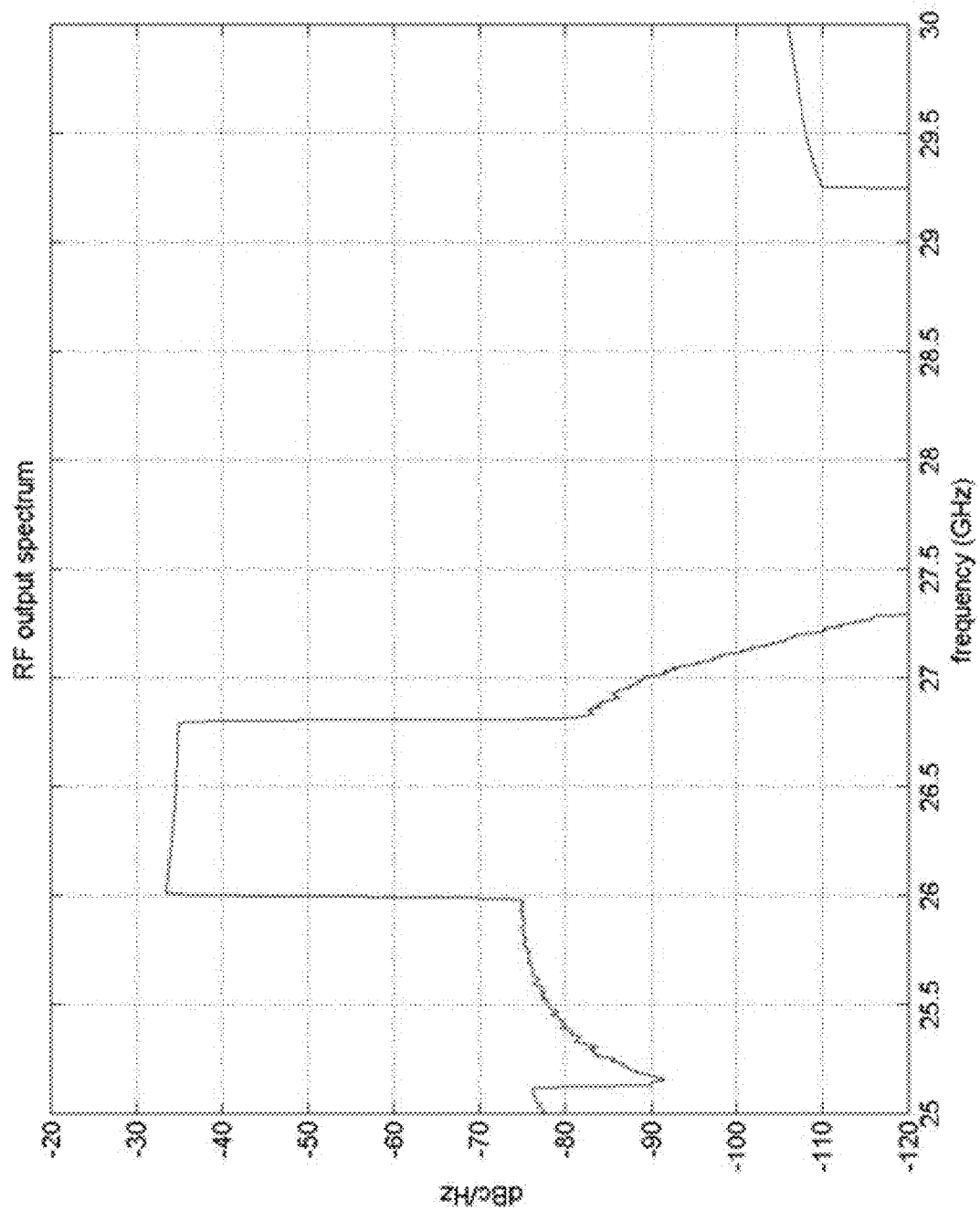
FIG. 8 illustrates a graph of an RF output spectrum in accordance with an embodiment of the invention.

FIG. 8 illustrates a graph of an RF output spectrum in accordance with an embodiment of the invention. As illustrated, the graph shows the output spectrum of a generated chirp signal at RF frequency. As illustrated, the RF chirp signal is between 26 GHz to 26.75 GHz. This synthesized RF chirp signal can be evaluated for signal generation performance.

Figure 9:
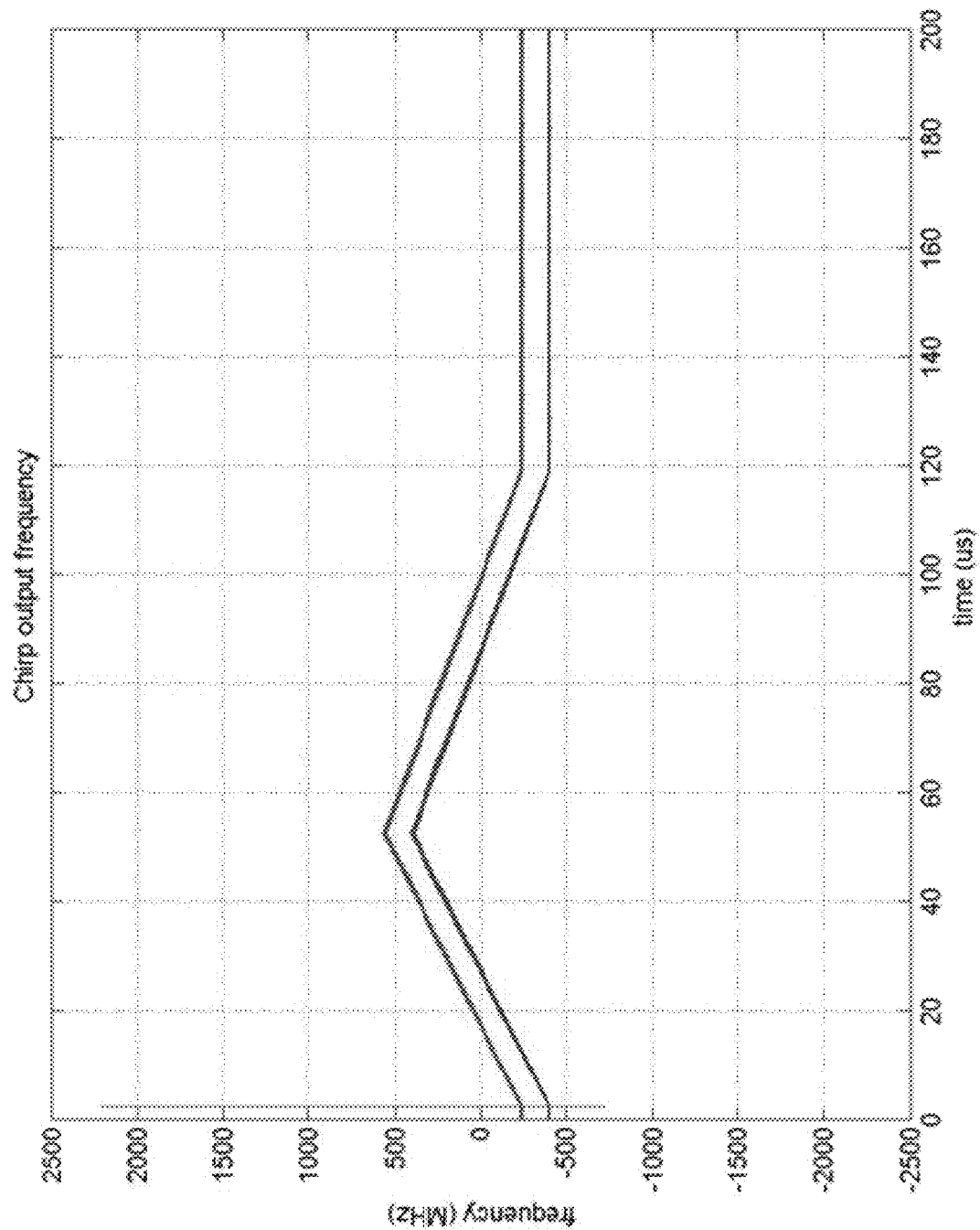
FIG. 9 illustrates a graph of chirp output frequency in accordance with an embodiment of the invention.

FIG. 9 illustrates a graph of chirp output frequency in accordance with an embodiment of the invention. The X-axis of the graph corresponds to time and the Y-axis corresponds to a frequency. As illustrated, the graph illustrates the output frequency offset of a synthesized RF chirp signal. Offset frequency 0 corresponds to the center of chirp frequency band. The chirp frequency band center is 26.8 GHz. There are 2 chirps in this example. The first chirp frequency ranges from 26.4 GHz to 27.2 GHz or −400 MHz to 400 MHz in frequency offset from 26.8 GHz. The second chirp frequency ranges from 26.56 GHz to 27.36 GHz or −240 MHz to 560 MHz in frequency offset from 26.8 GHz. Since the low IF chirp signal is synthesized digitally and has perfectly linear frequency ramp, the corresponding RF chirp signal also has perfectly linear frequency ramp as illustrated in the FIG. 9. Furthermore, the digital synthesized chirp can change frequency ramp direction instantaneously. Accordingly, the same property can be preserved in the RF chirp signal.

Figure 10:
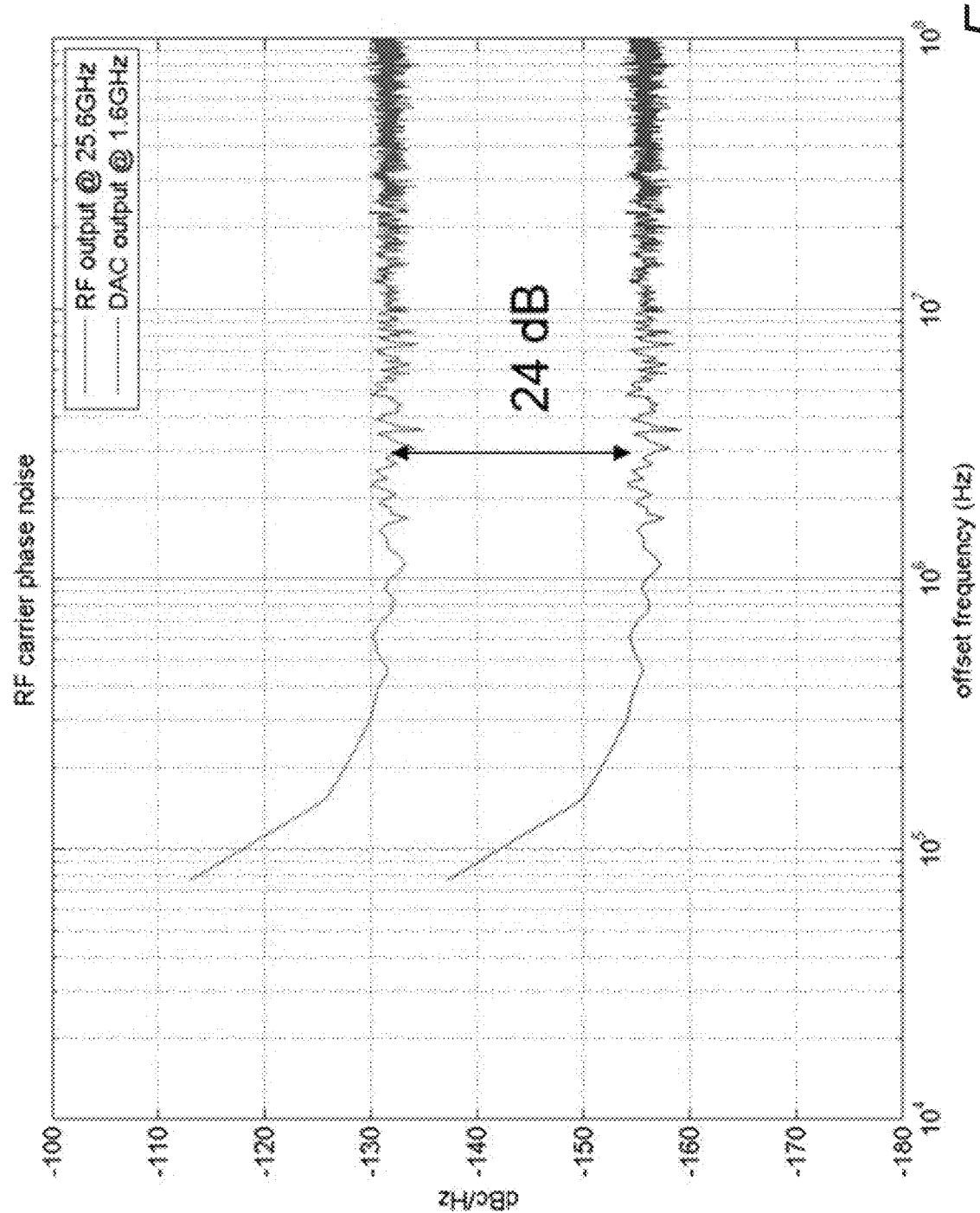
FIG. 10 illustrates a graph of RF carrier phase noise in accordance with an embodiment of the invention.

FIG. 10 illustrates a graph of RF carrier phase noise in accordance with an embodiment of the invention. The X-axis of the graph corresponds to an offset frequency (Hz) and the Y-axis corresponds to dBc/Hz. As illustrated, there is a difference of 24 dB between the RF output @ 25.6 GHz and the DAC output @ 1.6 GHz. As illustrated, the graph shows carrier phase noises of the low IF signal and RF signal. The delta between the two phase noises is about 24 dB or 20*log 10(16). In the example illustrated in FIG. 10, 16 is the frequency multiplication ratio. As illustrated, the phase noise performance of the low IF chirp is also preserved in the RF chirp signal.

Although the present invention has been described in certain specific aspects, many additional modifications and variations would be apparent to those skilled in the art. It is therefore to be understood that the present invention may be practiced otherwise than specifically described, including various changes in the implementation. Thus, embodiments of the present invention should be considered in all respects as illustrative and not restrictive.

What is claimed is:

1. A chirp signal generator comprising:
a direct digital frequency synthesizer (DDFS) that is configured to receive an input sync signal and a frequency reference signal and generate a plurality of chirp signals at a first frequency that is in a low intermediate frequency (IF) band;
a plurality of frequency multipliers that are configured to increase the plurality of chirp signals to higher frequencies that are multiples of the first frequency; and
a plurality of bandpass filter circuits that are configured to remove nonlinearities from the plurality of chirp signals to generate a clean output signal.

2. The chirp generator of claim 1, further comprising:
a first frequency doubler circuit that receives the first frequency and doubles the first frequency to generate a second frequency that is double the first frequency;
a second frequency doubler circuit that receives the second frequency and doubles the second frequency to generate a third frequency that is double the second frequency;
a third frequency doubler circuit that receives the third frequency and doubles the third frequency to generate a fourth frequency that is double the fourth frequency; and
a fourth frequency doubler circuit that receives the fourth frequency and doubles the fourth frequency to generate a fifth frequency that is double the fourth frequency.

3. The chirp generator of claim 2, wherein the first frequency is in the 1562.5-1750 MHz range, the second frequency is in the 3125-3500 MHz range, the third frequency is in the 6250-7000 MHz range, the fourth frequency is in the 12.5-14 GHz range, and the fifth frequency is in the 25-28 GHz range.

4. The chirp generator of claim 2, wherein the plurality of bandpass filter stages comprises a first bandpass filter circuit after the first frequency doubler circuit, a second bandpass filter circuit after the second frequency doubler circuit, and a third bandpass filter circuit after the third frequency doubler circuit.

5. The chirp signal generator of claim 1, wherein the direct frequency synthesizer comprises a high speed resonator that generates a frequency signal and an oscillator that receives the frequency signal and generates an output signal.

6. The chirp signal generator of claim 1, further comprising a plurality of amplifier circuits that amplify an input chirp signal to generate an amplified output signal.

7. The chirp signal generator of claim 1, wherein a chirp signal is denoted as x(t) where:

$$x(t) = \sin\left(2\pi\left(f_0 + \frac{\alpha}{2}t\right)t + \theta_0 + \varphi_n(t)\right)$$

$f_0$: initial frequency of the chirp signal,
$\alpha$: frequency ramp rate of the chirp signal,
$\theta_0$: initial phase of the chirp signal,
$\varphi_n(t)$: phase noise added in a digital-to-analog (DAC) process;
wherein a chirp signal is generated that is twice a carrier frequency of x(t) by passing x(t) through a frequency doubler circuit, wherein the frequency doubler circuit output is y(t) where:

$$y(t) = x(t)*x(t) = \left\{\sin\left(2\pi\left(f_0 + \frac{\alpha}{2}t\right)t + \theta_0 + \varphi_n(t)\right)\right\}^2 = \frac{1}{2}\left(1 - \cos\left(4\pi\left(f_0 + \frac{\alpha}{2}t\right)t + 2\theta_0 + 2\varphi_n(t)\right)\right).$$

8. The chirp signal generator of claim 1, wherein a band-pass filter is used to select the desired $2^{nd}$ order harmonic from a frequency doubler, wherein a band-pass filter output is z(t) where:

$$z(t) = k*\cos(2\pi(2f_0+\alpha t)t + 2\theta_0 + 2\varphi_n(t))$$

k: scale factor,
wherein the plurality of frequency multipliers comprises four (4) frequency doubler stages,
wherein the output of each stage is denoted as $z_i(t)$, (i=1,2,3,4), wherein:

$$z_1(t) = k_1*\cos(2\pi(2f_0+\alpha t)t + 2\theta_0 + 2\varphi_n(t))$$

$$z_2(t) = k_2*\cos(2\pi(4f_0+2\alpha t)t + 4\theta_0 + 4\varphi_n(t))$$

$$z_3(t) = k_3*\cos(2\pi(8f_0+4\alpha t)t + 8\theta_0 + 8\varphi_n(t))$$

$$z_4(t) = k_4*\cos(2\pi(16f_0+8\alpha t)t + 16\theta_0 + 16\varphi_n(t)).$$

9. The chirp signal generator of claim 1, further comprising:
   a first frequency quadrupler circuit that receives the first frequency and quadruples the first frequency to generate a second frequency that is four times the first frequency;
   a second frequency quadrupler circuit that receives the second frequency and quadruples the second frequency to generate a third frequency that is quadruple the second frequency.

10. The chirp signal generator of claim 1, further comprising filtering out harmonics and intermodulation components that do not fall within a particular frequency band to preserve a signal linearity during frequency multiplication stages.

11. A method of chirp signal generation, comprising:
   receiving, using a direct digital frequency synthesizer (DDFS), an input sync signal and a frequency reference signal and generating a plurality of chirp signals at a first frequency that is in a low intermediate frequency (IF) band;
   increasing, using a plurality of frequency multipliers, the plurality of chirp signals to a higher frequency that is a multiple of the first frequency; and
   removing, using a plurality of bandpass filter circuits, nonlinearities from the plurality of chirp signals to generate a clean output signal.

12. The method of claim 11, further comprising:
   receiving, at first frequency doubler circuit, the first frequency and doubling the first frequency to generate a second frequency that is double the first frequency;
   receiving, at a second frequency doubler circuit, the second frequency and doubling the second frequency to generate a third frequency that is double the second frequency;
   receiving, at a third frequency doubler circuit, the third frequency and doubling the third frequency to generate a fourth frequency that is double the fourth frequency; and
   receiving, at a fourth frequency doubler circuit, the fourth frequency and doubling the fourth frequency to generate a fifth frequency that is double the fourth frequency.

13. The method of claim 12, wherein the first frequency is in the 1562.5-1750 MHz range, the second frequency is in the 3125-3500 MHz range, the third frequency is in the 6250-7000 MHz range, the fourth frequency is in the 12.5-14 GHz range, and the fifth frequency is in the 25-28 GHz range.

14. The method of claim 12, wherein the plurality of bandpass filter stages comprises a first bandpass filter circuit after the first frequency doubler circuit, a second bandpass filter circuit after the second frequency doubler circuit, and a third bandpass filter circuit after the third frequency doubler circuit.

15. The method of claim 12, wherein the direct frequency synthesizer comprises a high speed resonator that generates a frequency signal and an oscillator that receives the frequency signal and generates an output signal.

16. The method of claim 11, further comprising amplifying, using a plurality of amplifier circuits, the plurality of chirp signals to generate an amplified output signal.

17. The method of claim 11, wherein a chirp signal is denoted as x(t) where:

$$x(t) = \sin\left(2\pi\left(f_0 + \frac{\alpha}{2}t\right)t + \theta_0 + \varphi_n(t)\right)$$

$f_0$: initial frequency of the chirp signal,
$\alpha$: frequency ramp rate of the chirp signal,
$\theta_0$: initial phase of the chirp signal,
$\varphi_n(t)$: phase noise added in a digital-to-analog (DAC) process;
wherein a chirp signal is generated that is twice a carrier frequency of x(t) by passing x(t) through a frequency doubler circuit, wherein the frequency doubler circuit output is y(t) where:

$$y(t) = x(t) * x(t) =$$
$$\left\{\sin\left(2\pi\left(f_0 + \frac{\alpha}{2}t\right)t + \theta_0 + \varphi_n(t)\right)\right\}^2 = \frac{1}{2}\left(1 - \cos\left(4\pi\left(f_0 + \frac{\alpha}{2}t\right)t + 2\theta_0 + 2\varphi_n(t)\right)\right).$$

18. The method of claim 11, wherein a band-pass filter is used to select the desired $2^{nd}$ order harmonic from a frequency doubler, wherein a band-pass filter output is z(t) where:

$$z(t)=k*\cos(2\pi(2f_0+\alpha t)t+2\theta_0+2\varphi_n(t))$$

k: scale factor,
wherein the plurality of frequency multipliers comprises four (4) frequency doubler stages,
wherein the output of each stage is denoted as $z_i(t)$, (i=1,2, 3,4), wherein:

$$z_1(t)=k_1*\cos(2\pi(2f_0+\alpha t)t+2\theta_0+2\varphi_n(t))$$

$$z_2(t)=k_2*\cos(2\pi(4f_0+2\alpha t)t+4\theta_0+4\varphi_n(t))$$

$$z_3(t)=k_3*\cos(2\tau(8f_0+4\alpha t)t+8\theta_0+8\varphi_n(t))$$

$$z_4(t)=k_4*\cos(2\tau(16f_0+8\alpha t)t+16\theta_0+16\varphi_n(t)).$$

19. The method of claim 11, further comprising:
   receiving, at a first frequency quadrupler circuit, the first frequency and quadrupling the first frequency to generate a second frequency that is four times the first frequency; and
   receiving, at a second frequency quadrupler circuit the second frequency and quadrupling the second frequency to generate a third frequency that is quadruple the second frequency.

20. The method of claim 11, further comprising filtering out harmonics and intermodulation components that do not fall within a particular frequency band to preserve a signal linearity during frequency multiplication stages.

* * * * *